United States Patent
Kim et al.

(10) Patent No.: US 9,666,716 B2
(45) Date of Patent: May 30, 2017

(54) FINFET TRANSISTOR

(71) Applicant: Sang U. Kim, Chandler, AZ (US)

(72) Inventors: Sang U. Kim, Chandler, AZ (US); Kuhwan Kim, Chandler, AZ (US)

(73) Assignee: Sang U. Kim, Chandler, AZ (US)

( * ) Notice: Subject to any disclaimer, the term of this patent is extended or adjusted under 35 U.S.C. 154(b) by 0 days.

(21) Appl. No.: 14/570,982

(22) Filed: Dec. 15, 2014

(65) Prior Publication Data

US 2016/0172445 A1    Jun. 16, 2016

(51) Int. Cl.
| | |
|---|---|
| *H01L 29/78* | (2006.01) |
| *H01L 29/786* | (2006.01) |
| *H01L 29/06* | (2006.01) |
| *H01L 29/66* | (2006.01) |

(52) U.S. Cl.
CPC .......... *H01L 29/785* (2013.01); *H01L 29/786* (2013.01); *H01L 29/7853* (2013.01); *H01L 29/7854* (2013.01); *H01L 29/7856* (2013.01); *H01L 29/0653* (2013.01); *H01L 29/6681* (2013.01)

(58) Field of Classification Search
CPC ............... H01L 29/36; H01L 29/7954; H01L 29/66795; H01L 29/785; H01L 27/0886; H01L 21/823431; H01L 29/0653; H01L 21/823821; H01L 27/1211; H01L 29/41791; H01L 21/845; H01L 29/4983; H01L 29/78; H01L 29/7853; H01L 29/7854; H01L 29/6681; H01L 29/786; H01L 29/7856; H01L 29/7858

See application file for complete search history.

(56) References Cited

U.S. PATENT DOCUMENTS

| | | |
|---|---|---|
| 2006/0113522 A1 | 6/2006 | Lee et al. |
| 2013/0270559 A1 | 10/2013 | Hafez et al. |
| 2014/0103437 A1 | 4/2014 | Kapoor et al. |
| 2014/0117426 A1 | 5/2014 | Cho et al. |
| 2014/0252557 A1 | 9/2014 | Flachowsky et al. |
| 2015/0228731 A1* | 8/2015 | Hsiao ..................... H01L 29/36 257/401 |

(Continued)

OTHER PUBLICATIONS

Bohr, "Intel's Revolutionary 22 nm Transistor Technology", Intel, May 2011 in 28 pages.

(Continued)

*Primary Examiner* — Thanh T Nguyen
(74) *Attorney, Agent, or Firm* — Knobbe, Martens, Olson & Bear LLP

(57) ABSTRACT

A semiconductor device includes a semiconductor substrate having isolation regions formed therein and a fin-shaped semiconductor structure protruding vertically above the isolation regions and extending laterally in a first direction. The device additionally includes a gate dielectric wrapping a channel region of the fin-shaped semiconductor structure and a gate electrode wrapping the gate dielectric. The channel region is interposed in the first direction between a source region and a drain region and has sloped sidewalls and a width that continuously decreases from a base towards a peak of the channel region. The channel region comprises a volume inversion region having a height greater than about 25% of a total height of the channel region.

18 Claims, 8 Drawing Sheets

(56) References Cited

U.S. PATENT DOCUMENTS

2015/0372140 A1* 12/2015 Liu ................. H01L 29/7848
257/190

OTHER PUBLICATIONS

Cauchy, "Fully depleted Silicon technology to underlie energy-efficient designs at 28 nm and beyond", Feb. 20, 2013 in 10 pages.
Chen et al., "Quantum Confinement, Surface Roughness, and the Conduction Band Structure of Ultrathin Silicon Membranes", ACSNANO, vol. 4, No. 4, published Mar. 19, 2010, pp. 2466-2474.
Clarke, "Intel FinFETs vary, may need SOI for shrink, says GSS", Jun. 6, 2012 in 5 pages.
Colinge, "The New Generation of SOI MOSFETs", Romanian Journal of Informatiion Science and Technology, vol. 11, No. 1, 2008, pp. 3-15.
Doyle et al., "High Performance Fully-Depleted Tri-Gate CMOS Transistors", IEEE Electron Device Letters, vol. 24, No. 4, Apr. 2003, pp. 263-265.
Ernst et al., "Ultimately Thin Double-Gate SOI MOSFETs", IEEE Transactions on Electron Devices, vol. 50, No. 3, Mar. 2003, pp. 830-838.
Gold Standard Simulations GSS, "Simulation analysis of the Intel 22nm FinFET", downloaded from http://www.goldstandardsimulations.com/news/blog_search/simulation-analysis-of-the-int . . . on Mar. 17, 2015.
Hook et al., "FinFET on SOI: Potential Becomes Reality", Semiconductor Manufacturing & Design Community, downloaded on Jan. 17, 2014 in 7 pages.
Intel finFETs show variability, need SOI for scaling, Gold Standard Simulations (GSS), Jun. 8, 2012 in 3 pages.
Merritt, "Intel Outlines 14nm, Broadwell", EE Times, Jun. 11, 2014 in 4 pages.
Smith, "Intel's 14nm Technology in Detail", AnandTech, Aug. 11, 2014 in 8 pages.
Thomas, "Electrical Characterization of Novel Silicon MOSFETs and finFETs", Apr. 2011 in 243 pages.
International Search Report and Written Opinion dated Feb. 29, 2016, PCT/US2015/063517.

* cited by examiner

FINFET TRANSISTOR

BACKGROUND

Field of the Invention

The disclosed technology relates generally to semiconductor devices, and more particularly to fin-shaped field-effect transistors (finFETs).

Description of the Related Art

Physical scaling of transistors continues to pose new challenges at each technology generation. Technological innovations such as strain engineering (e.g., strained silicon) and alternative materials (e.g., high-K gate dielectric and metal gates) have enabled manufacturers to continue to scale transistors to have channel lengths as short as 20-30 nm. For high performance logic applications, proposed paths to physical scaling of transistors to have channel lengths below 20-30 nm include silicon-on-insulator (SOI) technologies, in which transistor channels are formed using ultrathin silicon layers formed on a buried insulator layer to further scale the transistors, and multigate transistors such as dual-gate and tri-gate transistors, in which two- or three-dimensional transistor channels are formed using thin slab (e.g., vertical fin-shaped) structures. For the latter approach, scaling the physical dimensions (e.g., height, width) of the channel regions of the transistors in both vertical and horizontal directions while maintaining high on current and ON/OFF ratios remain a challenge.

SUMMARY

In one aspect, a semiconductor device includes a semiconductor substrate having isolation regions formed therein and a fin-shaped semiconductor structure protruding vertically above the isolation regions and extending laterally in a first direction. The device additionally includes a gate dielectric wrapping a channel region of the fin-shaped semiconductor structure and a gate electrode wrapping the gate dielectric. The channel region is interposed in the first direction between a source region and a drain region and has sloped sidewalls and a width that continuously decreases from a base towards a peak of the channel region. The channel region includes a volume inversion region having a minimum width between about 3 nm and about 4 nm and a maximum width between about 4 nm and about 8 nm, where the volume inversion region further has a height greater than about 25% of a total height of the channel region.

In another aspect, a semiconductor device includes a semiconductor substrate and a fin-shaped semiconductor structure extending laterally in a first direction and having a protruding portion protruding above adjacent isolation regions. The device additionally includes a gate stack formed on a channel region of the protruding portion, where the channel region is interposed laterally between a source region and a drain region. The gate stack includes a gate dielectric formed on the channel region and a gate electrode formed on the gate dielectric. The channel region has a vertical height not exceeding 32 nm and a base width not exceeding 16 nm, wherein the channel region has opposing sidewalls that are tapered such that the channel region has a volume inversion region that is at least 25% of a vertical height of the channel region. The volume inversion region has a doping concentration and physical dimensions such that when an inversion bias is applied to the gate electrode, conduction and valence band energies ($E_C$, $E_V$) within the inversion region fall below corresponding bulk conduction and valence band energies ($E_{C,BULK}$, $E_{V,BULK}$) of a bulk material of the channel region throughout a width of the channel region, wherein the width of the channel region extends in a second direction crossing the first direction.

DETAILED DESCRIPTION OF THE PREFERRED EMBODIMENT

An "ideal" metal-oxide-silicon (MOS) transistor comprises a channel region formed between a source and a drain. A gate dielectric is formed on the channel region, and the channel region of the transistor is controlled using the gate formed on the gate dielectric. As an increasing magnitude of voltage is applied between the gate and the source such that the gate-to-source ($V_{gs}$) voltage exceeds a threshold voltage ($V_t$) of the transistor, the channel region under the gate of the transistor becomes inverted, i.e., a conducting sheet of charge near the surface of the channel, referred to as an inversion layer, or a surface inversion layer, forms a conducting channel between the source and the drain, turning the transistor "ON." As the transistor size is scaled, the control of the channel region by the gate becomes degraded due to a phenomenon referred to in the industry as the short channel effect (SCE), which leads to degradation of various performance metrics, including reduced ON/OFF current ratio and increased subthreshold slope (SS). In the following, certain illustrative examples will be made using a transistor of one type, e.g., an n-channel transistor in which the channel region is formed by a sheet of electrons. However, the concepts apply equally to another type, e.g., a p-type channel transistor, in which the channel region is formed by a sheet of holes.

Figure 1B:
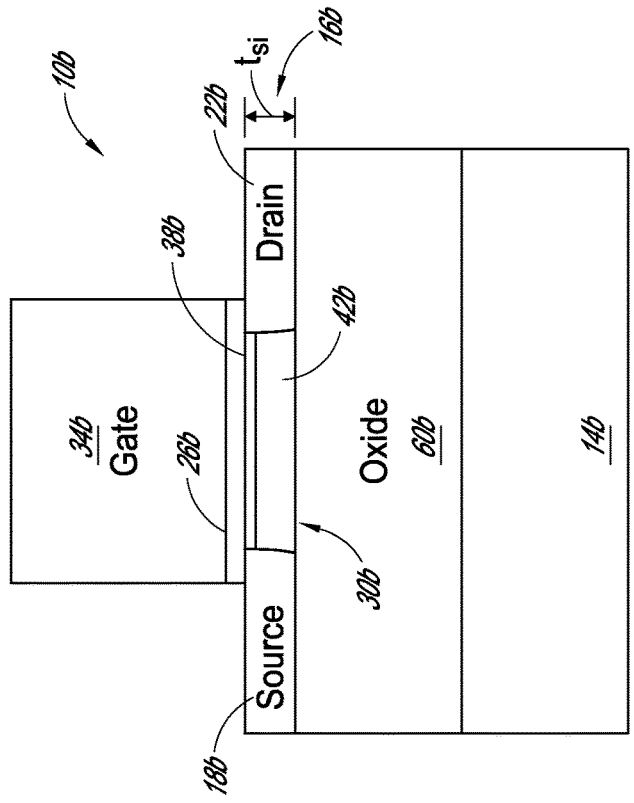
FIG. 1B is a schematic cross-sectional view of a silicon-on-insulator (SOI) transistor.
Figure 1A:
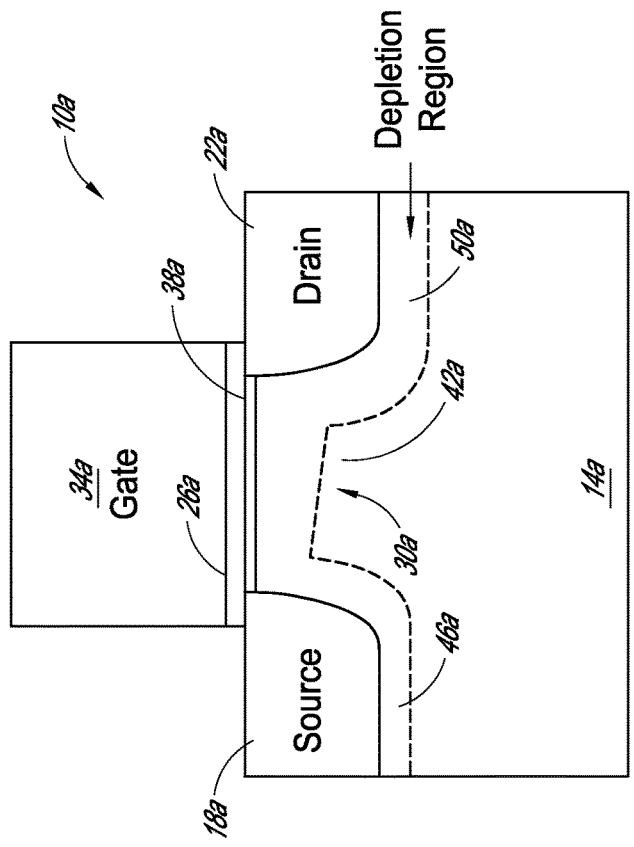
FIG. 1A is a schematic cross-sectional view of a bulk transistor.

FIG. 1A illustrates an n-channel planar bulk transistor 10a formed in a p-type substrate 14a. The planar bulk transistor 10a includes a p-type channel region 30a laterally interposed between a highly doped ($n^+$) source 18a and a highly doped ($n^+$) drain 22a. A gate dielectric 26a is formed on the p-type channel region 30a and a gate electrode 34a is formed on the gate dielectric 26a. The transistor 10a can be, for example, an n-channel enhancement mode MOSFET whose channel remains in the OFF (non-conducting) state when $V_{gs}$ is below a threshold voltage ($V_t$) of the transistor 10a. In operation, when $V_{gs} > V_t$, the surface region of the p-type channel region 30a becomes inverted and forms an n-type inversion layer 38a, thereby forming an inverted channel between the source 18a and the drain 22a. When a positive drain-to-source voltage $V_{ds}$ is applied, electrons will flow from the source 18a to the drain 22a. Increasing the gate bias increases the concentration of electrons in the inversion region 38a, and causes more current to flow.

Short channel effect (SCE) refers to a phenomenon in which a reduction of the MOSFET $V_t$ is observed as the channel length is reduced in dimensions. Referring still to FIG. 1A, as the device dimensions shrink, the fraction of the channel region 30a occupied by a source-substrate depletion region 46a and a drain-substrate depletion region 50a increases, thereby decreasing the fraction of charge in the channel region 30a that is controlled by the gate 34a. As a result, less gate charge and hence a smaller gate potential is now required to invert the channel, resulting in a lower $V_t$ as well as a lower ON/OFF current ratio. For planar transistors having channel lengths greater than about 20-30 nm, increasing the doping concentration of the channel region 30a has been employed as one mitigating approach to reduce the depletion region thicknesses. However, increasing the channel doping concentration can have limited benefit in transistors whose channel lengths are below about 20-30 nm, because it can degrade carrier mobilities due to increased scattering of the carriers and increase the threshold voltage.

Transistors formed in silicon-on-insulator (SOI) substrates have been used to reduce the short channel effect (SCE). FIG. 1B illustrates an n-channel transistor 10b formed in silicon-on-insulator (SOI). Similar to the n-channel transistor 10a described above with respect to FIG. 1A, the planar transistor 10b includes a p-type channel region 30b laterally interposed between highly doped (n$^+$) source 18b and highly doped (n$^+$) drain 22b. A gate dielectric 26b is formed on the p-type channel region 30b and a gate electrode 34b formed on the gate dielectric 26a. Unlike the transistor 10a of FIG. 1A, the n-channel transistor 10b is formed in a thin layer of silicon 16b that is separated from the bulk substrate 14b by a buried insulating material, known as a buried oxide 60b (BOX, e.g., SiO$_2$). BOX 60b can reduce the short channel effect by restricting the formation of the source-substrate and drain-substrate depletion regions described above with respect to FIG. 1A.

The characteristics of an SOI transistor, such as the n-channel transistor 10b of FIG. 1B, is dependent, among other things, on the thickness of the thin layer of silicon 16b ($t_{Si}$) and the doping concentration of the channel region 30b above the BOX 60b. To maximize the benefits of the SOI technology, SOI transistors have a layer of silicon 16b that has a thickness $t_{Si}$ that is less than the thickness of the depletion region 42b such that the entire volume of silicon layer 16b is depleted when the channel region 30b is inverted. Such transistors are sometimes referred to as fully-depleted SOI (FDSOI). While effective at reducing short channel effects, SOI transistors pose several manufacturing challenges. For example, fabricating a uniform ultra-thin layer of silicon 16b (typically <1/3 to 1/4 of the channel length $L_g$) can be a challenge. In addition, because of the presence of the BOX which can reduce heat dissipation from the channel regions to the substrate, SOI transistors can result in degraded carrier mobility due to increased temperatures. In addition, integrating SOI substrates can be expensive for high-volume manufacturing. Inventors have found that finFETs having a fin-shaped channel and having physical features described herein can provide the advantages of FDSOI planar transistors with respect to short channel effects while reducing cost and processing complexity and improving performance with respect to ON current, ON/OFF current ratio and subthreshold slope.

Figure 2:
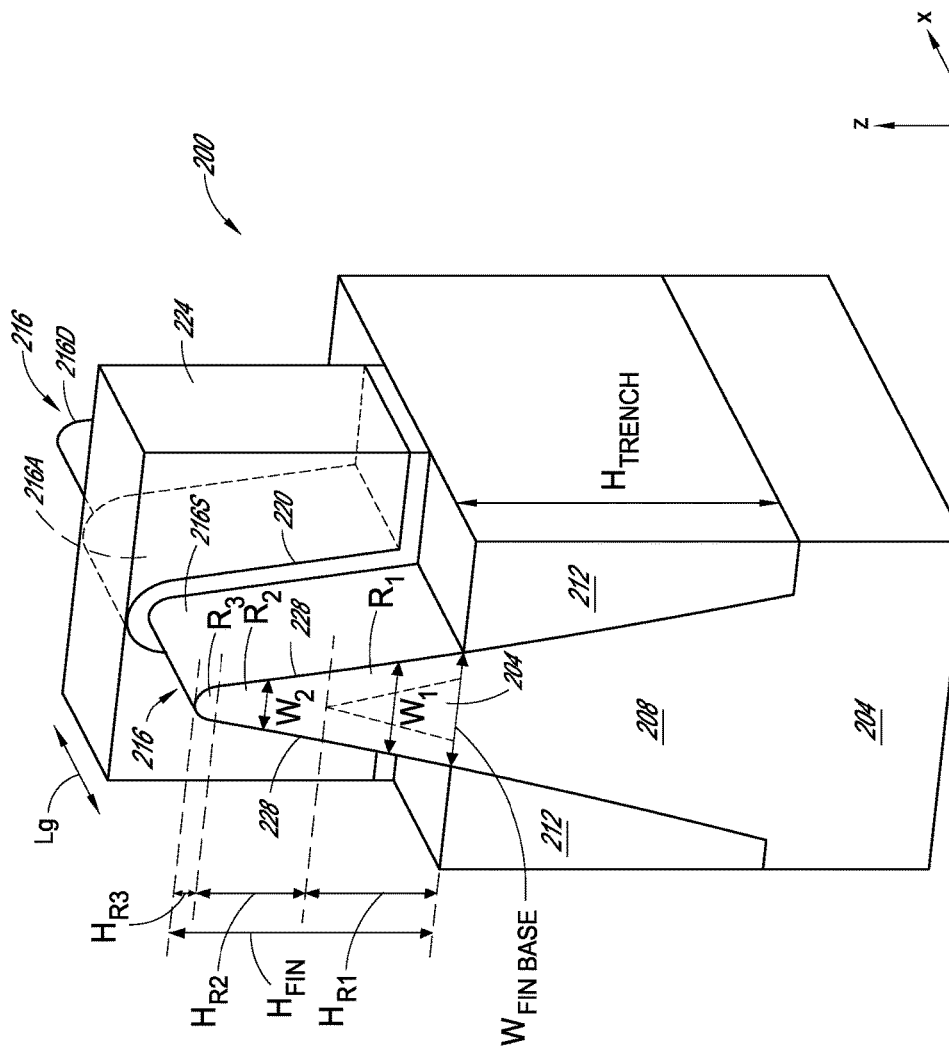
FIG. 2 is an isomeric view of a fin-shaped field-effect transistor (finFET) having a volume inversion region, according to embodiments.

FIG. 2 is an isometric view of a finFET 200 having a fin-shaped channel, according to embodiments. The finFET 200 comprises a thin fin-shaped semiconductor structure protruding vertically in a z-direction away from a bulk substrate 204. The fin-shaped structure is interposed in a y-direction between a pair of isolation regions 212, e.g., shallow trench isolation (STI) regions that bury a portion of the fin-shaped structure. The fin-shaped structure includes a buried fin portion 208 that is buried by the isolation regions 212 and does not protrude above top surfaces of the isolation regions 212. The fin-shaped structure additionally includes an active fin portion 216 that protrudes above the top surfaces of the isolation regions 212. The active fin portion 216 extends laterally in a channel direction, (x-direction) and comprises a channel region 216A interposed in the x-direction between a source region 216S and a drain region 216D. The finFET 200 additionally includes a gate stack including a dielectric 220 and a gate electrode 224. The gate dielectric 220 wraps the channel region 216A of the active fin portion 216 and the gate electrode 224 wraps the gate dielectric 220. In the illustrated embodiment, the gate dielectric 220 is formed between the gate electrode 224 and the channel region 216A. The gate stack extends in a y-direction across adjacent isolation regions 212. In the illustrated embodiment, the active fin portion 216 has sidewalls 228 facing each other and are tapered, i.e., sloped, at an angle less than 90 degrees with respect to the z-axis. The active fin portion 216 thus forms a trapezoidal fin-shaped structure which includes a trapezoidal channel region 216A and extends in the x-direction. The active fin portion 216 and the channel region 216A has a base width $W_{FIN,BASE}$ at a vertical level corresponding to the surface of the isolation regions 212. The finFET 200 has a physical gate length $L_g$ corresponding to a width of the gate electrode 224 in the x-direction (i.e., the channel direction). A gate width $W_g$ of the finFET 200 is defined by the length of an intersection in the y-z plane between the gate dielectric 220 and the active fin portion 216. Thus, an area of the channel can be defined as $L_g \times W_g$, which corresponds to an overlapping area between the gate electrode 224 and the active fin portion 216.

Inventors have found that, when a finFET is scaled such that its channel region 216A has a base width that is less than about 16 nm and further has sloped sidewalls, the device physics of some regions of the channel region departs significantly from classical semiconductor physics. By engineering the physical characteristics of some the regions of the channel region, a finFET having optimized performance can be obtained, including reduced short channel effects, enhanced ON current and ON/OFF current ratio, and reduced subthreshold slope, according to embodiments described herein. In particular, a finFET having a channel base width less than about 16 nm can be engineered to have what is referred to herein as a volume inversion region (R2 in FIG. 2). Without being bound by theory, the volume inversion region R2 can have a physical shape, dimensions, and doping level such that, under an inversion condition, the conduction and valence band energies ($E_C$, $E_V$) of the volume inversion region are less than the conduction and valence band energies ($E_{C,BULK}$, $E_{V,BULK}$) of the bulk semiconductor material throughout the channel region, e.g., when plotted in an energy-distance diagram in a the y-direction. In particular, embodiments include a channel region which comprises a volume inversion region defined by a vertical portion of the channel region that has a minimum width that is between about 3 nm and about 7 nm, between about 3 nm and about 5 nm or between about 3 nm and about 4 nm, and a maximum width that is between about 4 nm and about 8 nm or between about 5 nm and about 7 nm, for instance about 6 nm.

In some embodiments, volume inversion region (R2) extends directly from the bulk substrate. Under some circumstances, the volume inversion region is vertically interposed between what is referred to herein as a surface inversion region (R1) below the volume inversion region (R2) and what is referred to herein as a quantum confinement region (R3) above the volume inversion region. The quantum confinement region (R3) refers to a region in which physical dimensions approach or are smaller than the Bohr radius of excitons in the semiconductor material. In Si, inventors have found that quantum confinement occurs in regions of fin-shaped structures whose widths are less than, e.g., about 3-4 nm under some circumstances. Without being bound to any theory, unlike the volume inversion region (R2), the device physics of the R1 can be described by classical semiconductor model in which the conduction and valence band energies are lowered near the surfaces of the semiconductor volume, but increase to their bulk values outside of the depletion region that is formed under an inversion condition. The volume inversion and surface inversion conditions are described more in detail with respect to the electronic band diagram of FIG. 3, below. According to embodiments, when one or both of the surface inversion region (R1) and the quantum confinement region (R3) are present in addition to the volume inversion region (R2), the channel region is engineered such that the volume inversion region (R2) has a height greater than about 25% of a total height of the channel region, which can be defined as the total height of the R1, R2 and R3. In addition, according to embodiments, the channel region can be engineered such that the surface inversion region (R1) has a height less than about 70% of the total height of the channel region, and the quantum confinement region (R3) has a height less than about 20% of the total height of the channel region.

The physical characteristics of the surface inversion region (R1), the volume inversion region (R2) and the quantum confinement region (R3) of the illustrated embodiment in FIG. 2 are described in more detail in the following. In the illustrated embodiment, the channel region 216A of the finFET 200 is integrally connected to the bulk substrate 204 and includes, starting from its base, the surface inversion region (R1), the volume inversion region (R2) connected to the R1 and the quantum confinement region (R3) connected to the R2. The channel region 216A has a total height $H_{FIN}$ above the surfaces of the isolation regions 212, which includes the height of R1 having a height $H_{R1}$, R2 having a height $H_{R2}$ and R3 having a height of $H_{R3}$. While in the illustrated embodiment, all three regions R1, R2 and R3 are included in the channel region 216A, other embodiments are possible. For example, in other embodiments, the channel region 216A includes two of the three regions R1, R2 and R3 in FIG. 2 that are contiguous. For example, the channel region 216A can include the R1 and R2 but not include the R3, or include the R2 and R3 but not include the R1. In yet other embodiments, the channel region 216A includes only the R2. The dimensions and attributes of each of the three regions R1, R2 and R3 are described in the following, with reference to FIG. 2, the schematic band diagrams of FIG. 3 and the various embodiments of FIGS. 4A-4D.

Still referring to FIG. 2, in some embodiments, a base fin width $W_{FIN\ BASE}$ can generally correspond to a technology node, referred sometimes to as "x node," where x is a feature dimension (e.g., in nanometers) corresponding to, e.g., a minimum feature size. For example, a "100 nm node" can refer to a logic technology in which a gate length or other critical lithographically defined feature can be physically about 100 nm. However, the minimum features size can be substantially different from a named technology node. In various embodiments, $W_{FIN\ BASE}$ does not exceed 16 nm, 12 nm, 9 nm or 6 nm. In various embodiments, $W_{FIN\ BASE}$ can be between about 12 nm and about 16 nm or between about 13 nm and about 15 nm, for instance about 14 nm (e.g., FIG. 4A); between about 8 nm and about 12 nm or between about 9 nm and about 11 nm, for instance about 10 nm (e.g., FIG. 4B); between about 5 nm and about 9 nm or between about 6 nm and about 8 nm, for instance about 7 nm (e.g., FIG. 4C); or between about 2 nm and about 6 nm or between about 3 nm and about 5 nm, for instance about 4 nm (e.g., FIG. 4D).

In various embodiments, a total channel region height $H_{FIN}$ does not exceed about 34 nm. In various embodiments, $H_{FIN}$ can be between about 27 nm and about 35 nm or between about 29 nm and about 33 nm, for instance about 32 nm (e.g., FIG. 4A); between about 17 nm and about 25 nm or between about 19 nm and about 23 nm, for instance about 22 nm (e.g., FIG. 4B); between about 12 nm and about 20 nm or between about 14 nm and about 18 nm, for instance about 17 nm (e.g., FIG. 4C); or between about 8 nm and about 16 nm or between about 10 nm and about 14 nm, for instance about 12 nm (e.g., FIG. 4D).

Still referring to FIG. 2, inventors have found that the volume inversion region R2 can be particularly configured to be substantially entirely volume-inverted under an inversion condition by having certain widths. In various embodiments, the R2 has a minimum width that is between about 3 nm and about 7 nm, between about 3 nm and about 5 nm or between about 3 nm and about 4 nm, for instance about 3 nm, and has a maximum width that is between about 4 nm and about 8 nm or between about 5 nm and about 7 nm, for instance about 6 nm. In FIG. 2, the maximum and minimum widths correspond to lower and upper widths of the trapezoidal region defined by the R2.

In addition, inventors have found that the R2 having specific heights $H_{R2}$ relative to the total channel region height $H_{FIN}$ may be advantageous for maximum performance. In various embodiments, $H_{R2}$ represents greater than about 25%, greater than about 30%, greater than about 50% or greater than about 90% of the total channel region height $H_{FIN}$, or any range between these percentage values, such as between about 50% and 90% of $H_{FIN}$.

Still referring to FIG. 2, in various embodiments, the quantum confinement region (R3) has a maximum width that is the minimum width of the R2 as described above. In addition, in various embodiments, the R3 has a height $H_{R3}$ that does not exceed about 3 nm, for example between about 3 nm and about 1 nm, or that does not exceed about 2 nm, for example between about 2 nm and about 1 nm. In some embodiments, $H_{R3}$ represents less than 5%, 10%, 15% or 20% of the total channel region height $H_{FIN}$, or any range between these percentage values. Without being bound to any theory, the quantum confinement region refers to a region in which physical dimensions approach or are smaller than the Bohr radius of excitons in the semiconductor material. The carriers (electrons and holes or exitons) can be subject to quantum mechanical carrier confinement, which can result in, among other effects, an increase in the band gap of the semiconductor material, which can in turn result in a local increase in $V_t$. Thus, inventors have found that having the above dimensions is advantageous in achieving an overall performance of the finFET that is not adversely affected by the R3, such as, for example, increased $V_t$ distribution and the subthreshold slope, among other finFET characteristics.

Still referring to FIG. 2, in various embodiments, the surface inversion region (R1) has a minimum width that is the maximum width of R2 as described above, and a maximum width that is the $W_{FIN\_BASE}$ as described above. In addition, in various embodiments, the R1 has a height $H_{R1}=H_{FIN}-H_{R2}-H_{R3}$. For example, R1 can be less than 70%, 55%, 35% or 15% of $H_{FIN}$.

In some embodiments, a buried oxide similar to the buried oxide 60b described above with respect to FIG. 1B can be interposed vertically between the buried fin portion 208 and the substrate 204. By having the particular configuration of R1, R2 and R3 described above with respect to FIG. 2, inventors have found that a buried oxide does not provide additional benefit and therefore can be excluded between the fin-shaped semiconductor structure and the substrate 204, as illustrated in FIG. 2. Thus, the resulting finFET 200 can be manufactured at relatively lower cost.

In various embodiments, the substrate 204 is a semiconductor substrate. In some embodiments, the substrate is a silicon substrate having one of a (100) family of crystal planes as the main surface (the surface facing the z-direction in FIG. 2). In some embodiments, the fin-shaped semiconductor structure extends in a <110> family of silicon crystal directions, and the drain current $I_d$ of the resulting finFET 200 flows in the <110> direction. In such embodiments, the resulting finFET may be optimized for a p-channel transistor since the hole mobility in silicon may is relatively higher in the <110> direction compared to other crystal directions. In some other embodiments, the fin-shaped semiconductor structures are rotated by 45° such that they extend in a <100> family of silicon crystal directions, and the drain current $I_d$ of the resulting finFET 200 flows in the <100> directions. In such embodiments, the resulting finFET may be optimized for an n-channel transistor since the electron mobility may be relatively higher in the <100> direction compared to other crystal directions. In yet other embodiments, n-channel finFETs have channels extending in a <100> direction while p-channel finFETs have channels extending in a <110> direction.

Still referring to FIG. 2, according to various embodiments, the channel region 216A of the fin-shaped semiconductor structure can be p-doped for an n-channel finFET, n-doped for a p-channel finFET, or undoped to be essentially intrinsic for either a p-channel finFET or an n-channel finFET. In various embodiments, the channel region 216A has a net dopant concentration between about $1.5 \times 10^{10}/cm^3$ and about $1.0 \times 10^{16}/cm^3$, between about $1.5 \times 10^{10}/cm^3$ and about $1.0 \times 10^{14}/cm^3$, or between about $1.5 \times 10^{10}/cm^3$ and about $1.0 \times 10^{12}/cm^3$. In some implementations, having a lower dopant concentration can enhance carrier mobilities, which can increase $I_{ON}$ and $I_{ON}/I_{OFF}$ ratio. As used herein, a net dopant concentration refers to a difference between a concentration of a dopant of the type which forms the channel region of the finFET and a concentration of an opposite dopant type.

Still referring to FIG. 2, according to various embodiments, the gate dielectric 220 which wraps the channel region 216A can be formed of a suitable gate dielectric material, which includes a dielectric material such as, but not limited to, $SiO_2$, $Si_3N_4$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above various mixtures and combinations or stacks thereof, to name a few.

The effective oxide thickness (EOT) of the gate dielectric 220 can be selected for a desirable drive current of the transistor, and can be selected to have a value based on one or more of the channel length $L_g$, the effective channel width and the fin base width. In various embodiments, the EOT of the gate dielectric 220 can be selected to have a value between about 0.5 nm and about 2 nm, between about 0.7 nm and about 1.5 nm or between about 0.9 nm and about 1.3 nm, for instance about 1.0 nm.

The gate electrode 224 can be formed using a suitable metallic or semiconductor material, depending on whether the finFET 200 is an n-channel finFET (n-finFET) or a p-channel finFET (p-finFET), and based on a desired value of the threshold voltage. The threshold voltage depends in part on an energy difference between a metal work function of a metallic material of the gate electrode 224 and the Fermi level of the channel region 216A in embodiments where the gate electrode 224 includes a metal, or depends in part on an energy difference between the Fermi levels of the gate electrode 224 and the channel region 216A in embodiments where the gate electrode 224 includes a semiconductor.

In embodiments where the finFET 200 is an n-finFET, suitable materials for the gate electrode 224 include p-doped semiconductors such as p-doped polycrystalline silicon or a suitable "p-type" metal such that the work function $\Phi_{m,N}$ of the gate electrode 224 can be tuned to be between about 4.1 eV and about 4.65 eV, between about 4.1 eV and about 4.4 eV, or between about 4.4 eV and about 4.65 eV.

In embodiments where the finFET 200 is a p-finFET, suitable materials for the gate electrode 224 include n-doped semiconductors such as n-doped polycrystalline silicon or a suitable metal such that the work function $\Phi_{m,P}$ of the gate electrode 224 can be tuned to be between about 4.65 eV and about 5.2 eV, between about 4.65 eV and about 4.9 eV, or between about 4.9 eV and about 5.2 eV.

In various embodiments, suitable metals for the gate electrode 224 include, e.g., tungsten (W), titanium (Ti), tantalum (Ta), molybdenum (Mo), rubidium (Ru), TiN, TaN, TaCN, and $TaSi_xN_y$, to name a few. It will be appreciated that for low voltage CMOS applications, both n-finFETs and p-finFETs can include similar or identical base materials, with impurities to achieve the desired work functions described above.

In some embodiments, due to scaling of a supply voltage ($V_{dd}$), it is desirable to achieve a low and symmetrical threshold voltages for both transistor types (n-finFET and p-finFET). To achieve the symmetrical threshold voltages for both transistor types, in some embodiments, the gate electrodes are chosen for n-finFET and p-finFET such that the differences ($\Phi_{m,P}-E_F$) and ($\Phi_{m,N}-E_F$), where $E_F$ is the Fermi level of the channel region 216A, do not exceed about 0.5 eV, 0.3 eV, or 0.2 eV.

Still referring to FIG. 2, inventors have found that configuring the active fin portion 216 to have a generally trapezoidal shape can be advantageous for several reasons. From a fabrication point of view, having the trapezoidal shape provides enhanced structural support for the active fin portion 216. In addition, having sidewalls 228 that are tapered can be significantly easier to process compared to sidewalls that are essentially vertical (e.g., between 89 and 90 degrees). Furthermore, having tapered sidewalls 228 generally makes it easier to fill the isolation regions 212 using techniques such as chemical vapor deposition or high density plasma chemical vapor deposition without forming undesirable voids therein. In various embodiments, the tapered sidewalls 228 can form an angle relative to the z-axis between about 88 degrees and about 80 degrees, between about 88 degrees and about 82 degrees or between about 88 degrees and about 85 degrees.

Still referring to FIG. 2 the inventors have found that, to suppress short channel effects in finFET 200, the base width of the active region above the surface of the isolation regions 212 is preferably about equal to or larger than the gate length $L_g$. Thus, for the illustrated embodiment of the finFET 200 of FIG. 2 having a trapezoidal shape with a continuously decreasing width above the surface level of the isolation regions 212, $W_{FIN\ BASE}$ is between about 80% and about 200% of $L_g$, or between about 90% and about 150% of $L_g$, or between about 100% and about 120% of $L_g$.

Figure 3:
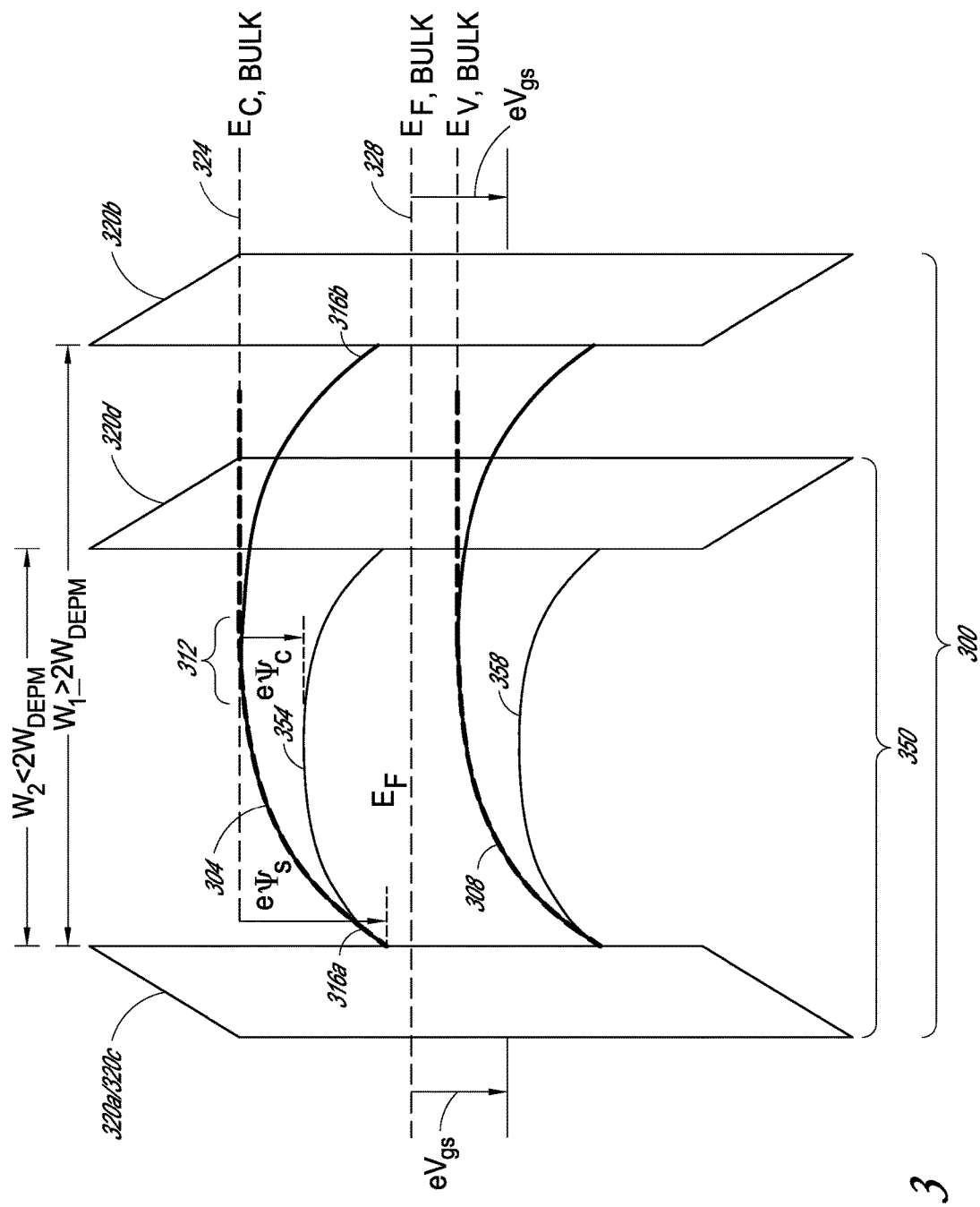
FIG. 3 shows a plurality of electronic band diagrams of regions of a finFET having a volume inversion region, according to embodiments.

FIG. 3 shows schematic electronic band diagrams representative of two regions of a finFET similar to the surface inversion region R1 and the volume inversion region R2 of the finFET 200 described above with respect to FIG. 2. Generally, electronic band diagrams graph electronic energies as a function of a lateral location, e.g., within a width (y-direction in FIG. 2). In the finFETs, the proximity the gate electrode on the two sidewalls of the channel region of the finFET results the electrostatics that are significantly different from planar transistors described above with respect to FIGS. 1A and 1B. Without being bound to theory, it has been found that because of the relatively narrow width of the channel region, the inversion charge distribution can vary significantly within various portions of the channel region, depending, among other things, on the width of the channel region.

FIG. 3 schematically illustrates schematic electronic band diagrams 300 and 350 corresponding physically to sections taken across the channel regions 216A of the finFET 200 of FIG. 2 at a vertical level corresponding to a width ($W_1$) taken within the surface inversion region (R1) and at a vertical level corresponding to a width ($W_2$) taken within the volume inversion region (R2), respectively. The band diagram 300 shows a conduction band 304 and a valence band 308 of the channel region of the finFET between the electronic bands 320a and 320b of the gate dielectrics on first and second sides of the channel region at a vertical level corresponding to $W_1$ within the R1 (FIG. 2). The band diagram 350 shows a conduction band 354 and a valence band 358 of the channel region of the finFET between the electronic bands 320c and 320d of the gate dielectrics on first and second sides of the channel region at a vertical level corresponding to $W_2$ within the R2 (FIG. 2). $E_{F,\ BULK}$ refers to the Fermi energy of the channel region of the finFET. A conduction band 324 ($E_{C,BULK}$) and a valence band 328 ($E_{V,BULK}$) in a corresponding bulk single gate planar transistor are also indicated by dotted lines.

Bending of the various bands in FIG. 3 shows the effect of a decreasing width of the channel region at a constant gate-source voltage $V_{gs}$, as indicated by the energy level shift ($eV_{gs}$) at the gate electrode. The band diagram 300 illustrates that, in the surface inversion region R1, under an inversion condition, $W_1$ is greater than or equal to twice a depletion width $W_{DEPM}$ (the depletion width that would be formed in a corresponding bulk channel with the same doping and material); i.e., $W_1 \geq 2W_{DEPM}$ for two sides of the channel region. Under this condition, a neutral region 312 exists, in which band bending occurs by a very small amount or essentially does not occur, which corresponds to the region 204 in FIG. 2. In the neutral region, conduction band 304 and valence band 308 approach the value of corresponding bulk energies $E_{C,BULK}$ and $E_{V,BULK}$, respectively. Under this condition, an inversion charge $Q_{inv}$ is relatively localized to the interface regions 316a and 316b between the gate dielectric and the semiconductor material of the channel region. The concentration of the carriers in the inversion region is determined in part by the voltage drop $\psi_S$. Because there are two interface regions 316a and 316b in which surface inversion occurs, the drive current $I_{ds}$ is increased (e.g., doubled) compared to a planar transistor having a single gate.

Unlike the surface inversion region R1, in the volume inversion region R2, under an inversion condition, $W_2$ is less than twice the maximum depletion width $W_{DEPM}$ (i.e., $W_2 < 2 W_{DEPM}$ for two sides of the channel region), and a neutral region does not exist. Under this condition, because of the proximity of the gate electrodes on the two sides of the channel region, the energies of conduction band 354 and valence band 358 fall below the corresponding bulk energies $E_{C,BULK}$ and $E_{V,BULK}$ across the entire width of the channel region, and the inversion charges $Q_{inv}$ are no longer localized to the interface regions 316b and 316b, but are distributed throughout the volume of the R2. As used herein, this condition is referred to as volume inversion. Inventors have found that it is desirable to have a relatively large volume of the channel area that is configured to undergo volume inversion when the finFET is turned on. Without being bound to any theory, one of the advantages of having a relatively large volume inversion region R2, is that a higher amount of current flows further away from the gate dielectric/channel interface regions. This can be advantageous because these interface regions can have, among other things, interface scattering centers that can degrade electron and/or hole mobilities ($\mu_n$ and/or $\mu_p$), which in turn results in drive current and/or subthreshold slope degradation. In addition, the width $W_2$ of the active fin region can be substantially lowered below $2W_{DEPM}$ and still maintain a high $I_{ON}$ and high $I_{ON}/I_{OFF}$ ratio.

In the above, the inversion condition can be satisfied when a gate voltage between about 0.2V and 1.0V, between about 0.2V and about 0.8V, or between about 0.2V and about 0.6V is applied to the gate electrode, relative to ground, e.g., the substrate or the buried portion of the fin-shaped structure.

FIGS. 4A-4D illustrate cross-sectional views of finFETs 400, 420, 440, and 460, respectively, according to various embodiments. The finFETs 400, 420, 440 and 460 can, without limitation, correspond to technology nodes 14 nm, 10 nm, 7 nm and 4 nm, respectively. The views of FIGS. 4A-4D represent cross-sections of the channel regions (similar to the channel region 216A in FIG. 2 taken in a plane (y-z plane) perpendicular to a channel direction (x-direction)). The illustrated finFETs include a buried fin portion 208 having isolation regions 212 formed adjacent or around it. The buried fin portion 208 can have a similar material, orientation and doping level as the semiconductor substrate described above with respect to FIG. 2. The channel regions of the finFETs illustrated in FIGS. 4A-4D extend laterally in the x-direction into and out of the pages and is interposed between source and drain regions (similar to source and drain regions 216S, 216D of FIG. 2, not shown in FIGS. 4A-4D). For clarity, the gate dielectric and gate electrode are not illustrated in FIGS. 4A-4D, but are present in a similar manner as that described with respect to FIG. 2. That is, a gate dielectric wraps the channel regions and a gate electrode wraps the gate dielectric.

In finFETs 400, 420, 440, and 460 of FIGS. 4A-4D, the channel region includes at least a volume inversion region (R2) and a quantum confinement region (R3) of three regions described above with respect to FIG. 2, namely a surface inversion region (R1), a volume inversion region (R2) and a quantum confinement region (R3). The finFETs 400, 420, 440, and 460 have a volume inversion region (R2)

that has a minimum width between about 3 nm and about 4 nm and a maximum width between about 4 nm and about 8 nm, and a height greater than about 25% of a total height of the channel region. The R1 of the finFETs in FIGS. 4A-4D are similar to R1 described above with respect to FIGS. 2 and 3, and has a maximum width at the base of the fin given by $W_{FIN\ BASE}$ and a minimum width at the base of the R2 given by $W_{R2\ MAX}$. The width within R1 is greater than or equal to twice the depletion width 2 $W_{DEPM}$ as described above with respect to FIG. 3, such that under an inversion condition, without being bound to any theory, a neutral region exists in the central region (similar to 204 in FIG. 2), in which band bending does not occur and the maximum of conduction and valence band energies do not fall below the corresponding bulk energies $E_{C,BULK}$ and $E_{V,BULK}$, respectively.

Additionally, the R2 of the finFETs in FIGS. 4A-4D are similar to R2 described above with respect to FIGS. 2 and 3, and has a maximum width at the base of the R2 given by $W_{R2\ MAX}$ and a minimum width at the base of the R3 given by $W_{R2\ MIN}$. The width within R2 is less than twice the depletion width $2W_{DEPM}$ as described above with respect to FIG. 3, such that under an inversion condition, without being bound to any theory, a neutral region does not exist, and the conduction and valence band energies fall below the corresponding bulk energies $E_{C,BULK}$ and $E_{V,BULK}$, respectively, across substantially the entire volume of the R2.

Additionally, the R3 of the finFETs in FIGS. 4A-4D are similar to R3 described above with respect to FIG. 2, and has a maximum width whose value is given by $W_{R2\ MIN}$ at its base and continuously decreases towards the peak of the fin.

The finFETs in FIGS. 4A-4D have sloped sidewalls, the angles of which can be quantified by θ at the sidewalls of the R2 relative to the z-direction and have values similar to that described above with respect to FIG. 2.

Figure 4A:
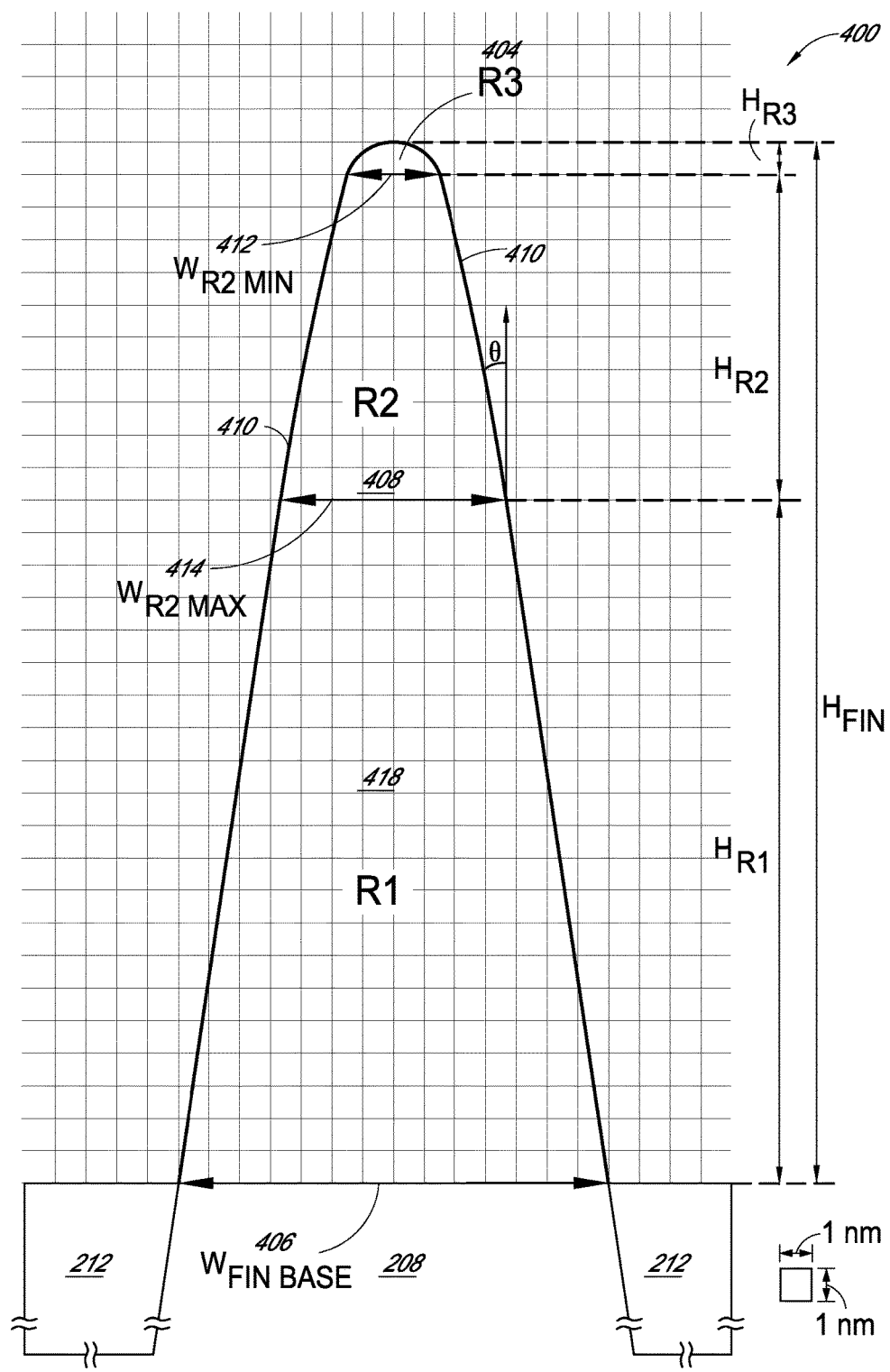
FIGS. 4A-4D are cross-sectional views of channel regions of finFETs having various dimensions and configurations of volume inversion regions, according to various embodiments.

Referring to FIG. 4A, the finFET 400 according to an embodiment includes a surface inversion region (R1) 418 connected to and forming an extension of the semiconductor material of the buried fin portion 208, a volume inversion region (R2) 408 connected to and forming an extension of the semiconductor material of the R1 418, and a quantum confinement region (R3) 404 connected to and forming an extension of the semiconductor material of the R2 408.

The finFET 400 has a base width $W_{FIN\ BASE}$ 406 that is between about 12 nm and about 16 nm or between about 13 nm and about 15 nm, for instance about 14 nm; a maximum volume inversion width $W_{R2\ MAX}$ 414 that is between about 4 nm and about 8 nm, for instance about 7 nm, and a minimum volume inversion width $W_{R2\ MIN}$ 412 that is between about 3 nm and about 4 nm, for instance about 3 nm.

The finFET 400 has a first height $H_{R1}$ that is between about 17 nm and about 25 nm or between about 19 nm and about 23 nm, for instance about 21 nm, a second height $H_{R2}$ that is between about 8 nm and about 12 nm or between about 9 nm and about 11 nm, for instance about 10 nm, and a third height $H_{R3}$ that is less than about 2 nm, for instance about 1 nm. The finFET 400 has a total height $H_{FIN}$ that is between about 28 nm about 36 nm or between about 30 nm and about 34 nm, for instance about 32 nm.

The finFET 400 has a ratio of the second height $H_{R2}$ to the total height $H_{FIN}$ that exceeds about 30%.

Figure 4B:
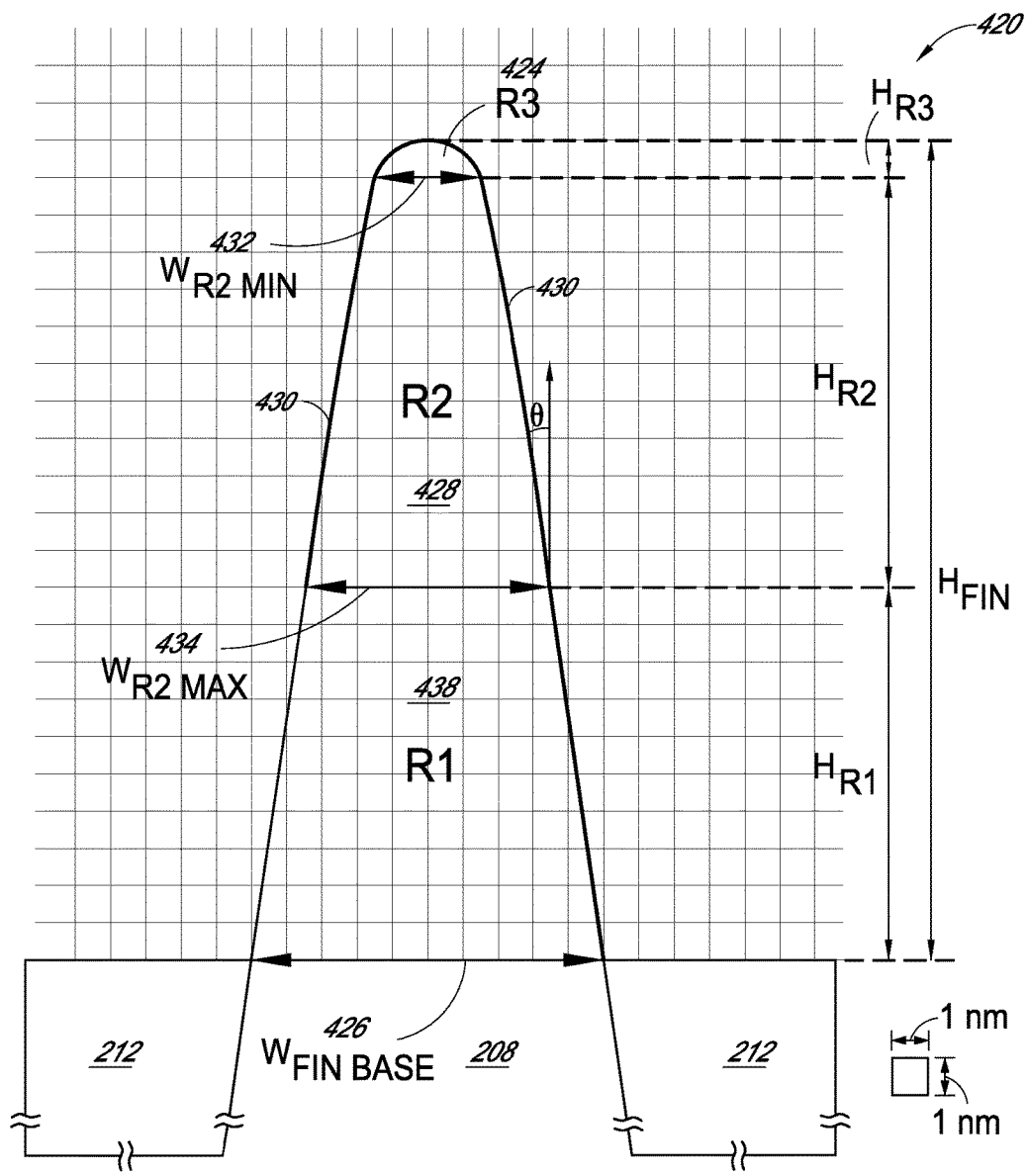

Referring to FIG. 4B, similar to the finFET 400 of FIG. 4A, the finFET 420 according to another embodiment includes a surface inversion region (R1) 438, a volume inversion region (R2) 428 and a quantum confinement region (R3) 424.

The finFET 420 has a base width $W_{FIN\ BASE}$ 426 that is between about 8 nm and about 12 nm or between about 9 nm and about 11 nm, for instance about 10 nm; a maximum volume inversion width $W_{R2\ MAX}$ 434 that is between about 4 nm and about 8 nm, for instance about 7 nm, and a minimum volume inversion width $W_{R2\ MIN}$ 432 that is between about 3 nm and about 4 nm, for instance about 3 nm.

The finFET 420 has a first height $H_{R1}$ of the R1 that is between about 8 nm and about 12 nm or between about 9 nm and about 11 nm, for instance about 10 nm, a second height $H_{R2}$ that is between about 9 nm and about 13 nm or between about 10 nm and about 12 nm, for instance about 11 nm, and a third height $H_{R3}$ that is less than about 2 nm, for instance about 1 nm. The finFET 400 has a total height $H_{FIN}$ that is between about 17 nm about 25 nm or between about 19 nm and about 23 nm, for instance about 21 nm.

The finFET 420 has a ratio of the second height $H_{R2}$ to the total height $H_{FIN}$ that exceeds about 50%.

Figure 4C:
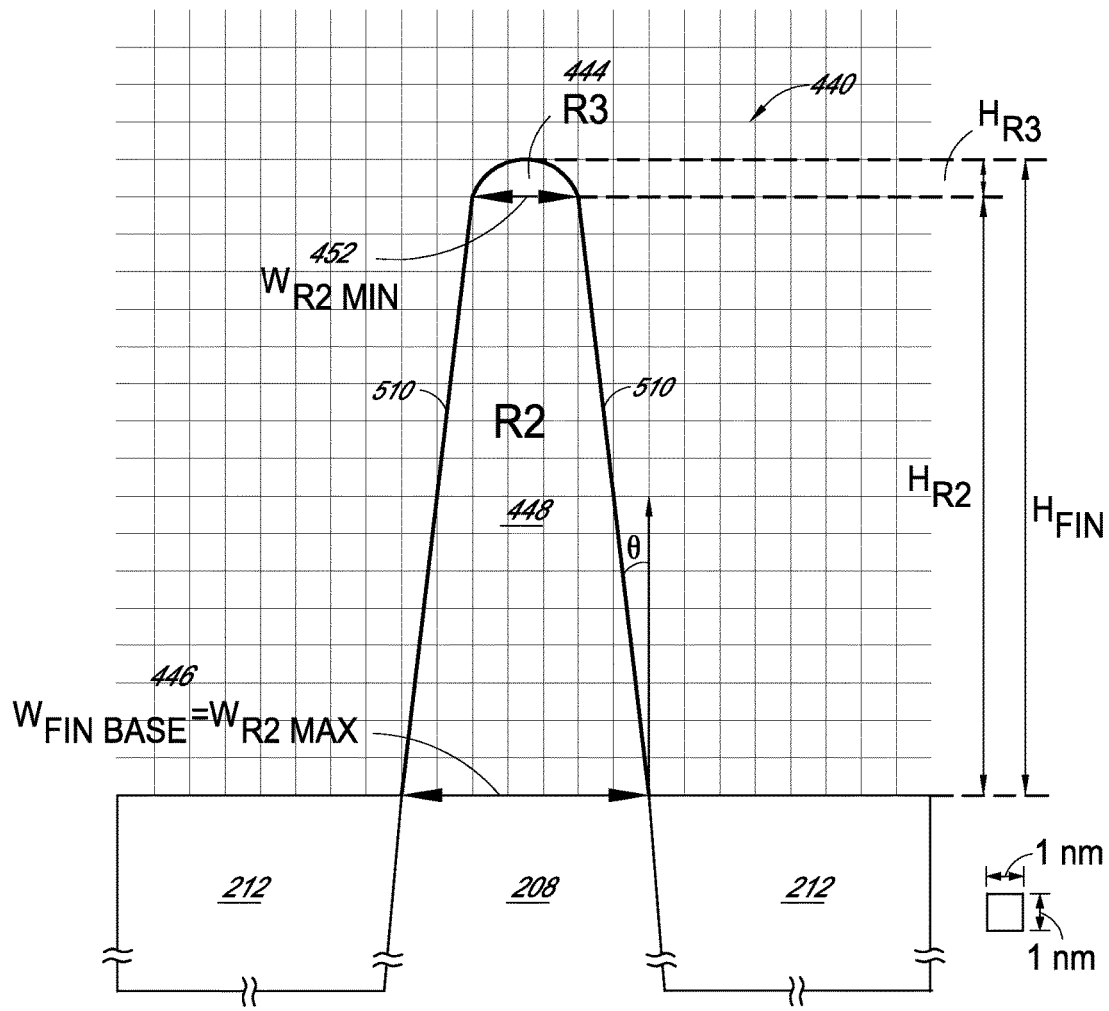

Referring to FIG. 4C, similar to the finFETs 400 and 420 of FIGS. 4A and 4B, respectively, the finFET 440 according to another embodiment includes a volume inversion region (R2) 448 and a quantum confinement region (R3) 444. However, unlike the finFETs 400 (FIG. 4A) and 420 (FIG. 4B), the finFET 440 does not include a surface inversion region (R1). Thus, under an inversion condition, a surface inversion does not occur in finFET 440 when R2 is volume-inverted.

The finFET 440 has a base width $W_{FIN\ BASE}$ 446, which is equal to $W_{R2}$ MAX, that is between about 4 nm and about 8 nm, for instance about 7 nm, and a minimum volume inversion width $W_{R2\ MIN}$ 452 that is between about 3 nm and about 4 nm, for instance about 3 nm.

The finFET 440 has a second height $H_{R2}$ that is between about 14 nm and about 18 nm or between about 15 nm and about 17 nm, for instance about 16 nm, and a third height $H_{R3}$ that is less than about 2 nm, for instance about 1 nm. The finFET 440 has a total height $H_{FIN}$ that is between about 13 nm about 21 nm or between about 15 nm and about 19 nm, for instance about 17 nm.

The finFET 440 has a ratio of the second height $H_{R2}$ to the total height $H_{FIN}$ that exceeds 90%.

Figure 4D:
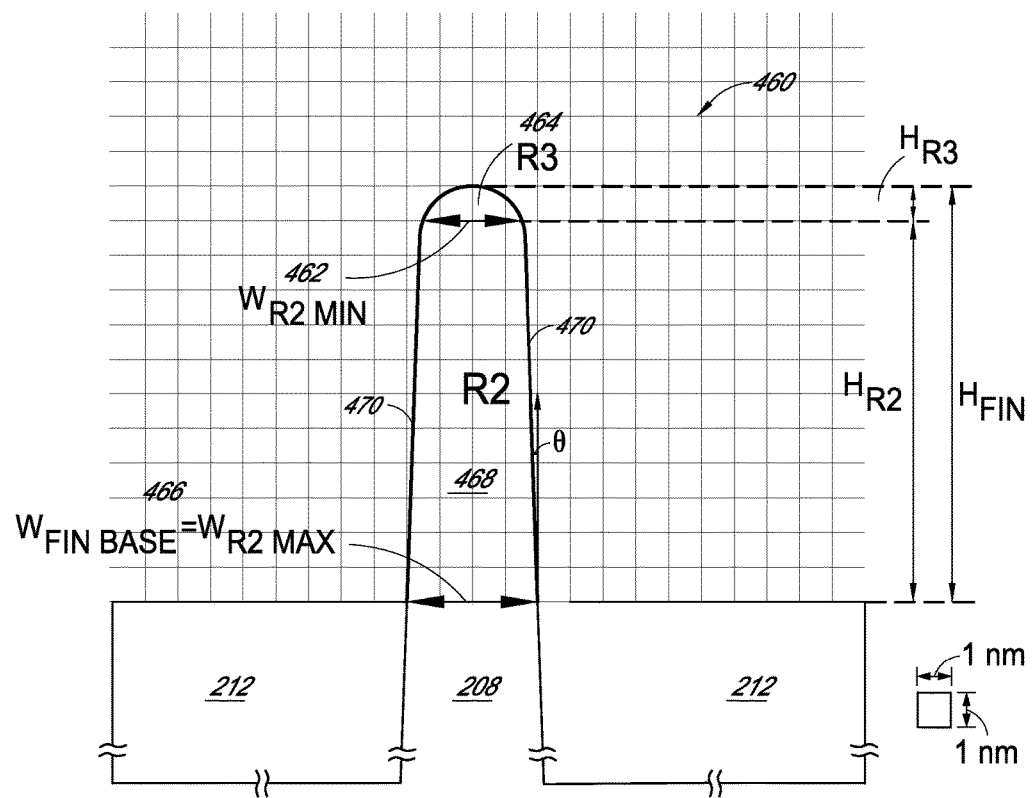

Referring to FIG. 4D, similar to the finFET 400 and 420 of FIGS. 4A and 4B, respectively, the finFET 460 according to another embodiment includes a volume inversion region (R2) 468 and a quantum confinement region (R3) 464. However, unlike the finFETs 400 and 420 but similar to the finFET 440 of FIG. 4C, the finFET 460 does not include a surface inversion region (R1). Thus, under an inversion condition, a surface inversion does not occur in finFET 460 when R2 is volume inverted.

The finFET 460 has a base width $W_{FIN\ BASE}$ 466, which is equal to $W_{R2}$ MAX, that is between about 4 nm and about 8 nm, for instance about 4 nm, and a minimum volume inversion width $W_{R2\ MIN}$ 462 that is between about 3 nm and about 4 nm, for instance about 3 nm.

The finFET 460 has a second height $H_{R2}$ that is between about 8 nm and about 12 nm or between about 9 nm and about 11 nm, for instance about 10 nm, and a third height $H_{R3}$ that is less than about 2 nm, for instance about 1 nm. The finFET 460 has a total height $H_{FIN}$ that is between about 10 nm about 14 nm or between about 11 nm and about 13 nm, for instance about 12 nm.

The finFET 460 has a ratio of the second height $H_{R2}$ to the total height $H_{FIN}$ that exceeds about 90%.

Figure 5:
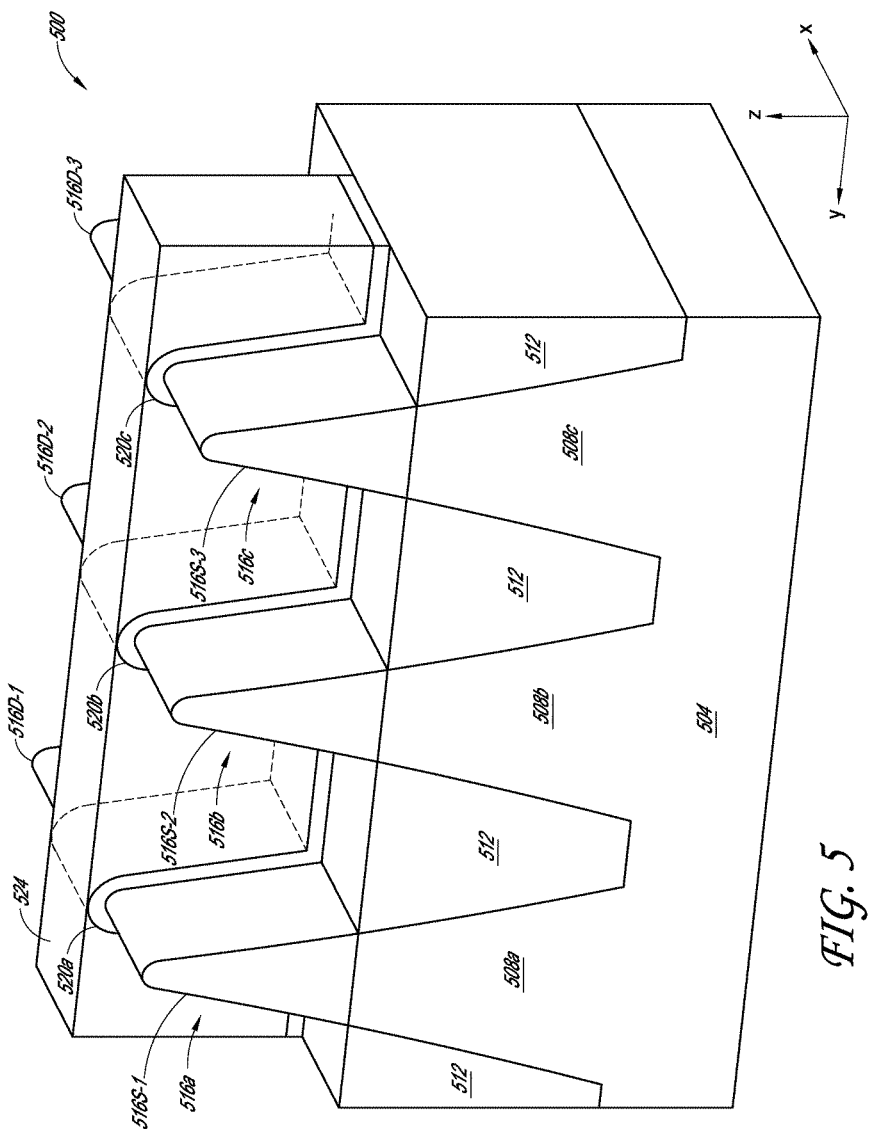
FIG. 5 is an isomeric view of a plurality of fin-shaped field-effect transistors (finFETs) having volume inversion regions, according to embodiments.

Referring to FIG. 5, multiple finFETs similar to various embodiments described above can be connected by a common gate electrode to increase the overall drive current. FIG. 5 illustrates a finFET device 500 which includes a plurality of active fin regions 516a, 516b and 516c, each separated by adjacent isolation regions 512 and each having a source region (516S-1, 516S-2 and 516S-3, respectively) and a drain region (516D-1, 516D-2 and 516D-3, respectively). The active fin regions 516a, 516b and 516c form continuous extensions of the buried fin portions 508a, 508b and 508c, respectively, each of which continuously extend from a bulk substrate 504. The plurality of active fin regions are wrapped by a gate dielectric 520a, 520b and 520c, which can be continuous, as in the illustrated embodiment. A common gate electrode 524 is formed on the gate dielectrics, such that the plurality of active fin regions are controlled by a single gate voltage applied to the gate electrode 524. A channel region (not labeled) is formed under each of the gate dielectrics 520a, 520b and 520c and the gate electrode 524, and between the respective source and drain regions.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A semiconductor device, comprising:
   a semiconductor substrate having isolation regions formed therein;
   a fin-shaped semiconductor structure protruding vertically above the isolation regions and extending laterally in a first direction, wherein the fin-shaped semiconductor structure forms a continuous extension of a bulk semiconductor substrate without having a buried oxide layer below the fin-shaped semiconductor structure; and
   a gate dielectric directly overlying a channel region of the fin-shaped semiconductor structure and a gate electrode directly overlying the gate dielectric, the channel region being interposed in the first direction between a source region and a drain region,
   wherein the channel region has sloped sidewalls and a width that continuously decreases from a base towards a peak of the channel region,
   wherein the channel region comprises an undoped volume inversion region having a minimum width between about 3 nm and about 4 nm and a maximum width between about 4 nm and about 8 nm, the volume inversion region further having a height extending downwardly from an apex of the fin-shaped semiconductor structure, the height being greater than about 25% of a total height of the channel region, and
   wherein the volume inversion region comprises a region in which, under an inversion condition, surface depletion regions extending from the opposing sloped sidewalls overlap.

2. The semiconductor device of claim 1, wherein the total height of the channel region does not exceed 34 nm.

3. The semiconductor device of claim 2, wherein the channel region has a maximum base width that does not exceed 16 nm.

4. The semiconductor device of claim 3, wherein the height of the volume inversion region is greater than about 50% of the total height of the channel region.

5. The semiconductor device of claim 3, wherein the channel region further comprises a quantum confinement region formed above the volume inversion region, the quantum confinement region having physical dimensions that are about the same or smaller than a calculated Bohr radius of excitons in a semiconductor material of the semiconductor substrate, wherein the quantum confinement region does not exceed about 20% of the total height of the channel region.

6. The semiconductor device of claim 5, wherein the channel region further comprises a surface inversion region formed below the volume inversion region and having a height that is a remainder of the total height of the channel region and does not exceed 70% of the total height of the channel region.

7. The semiconductor device of claim 5, wherein the volume inversion region has a carrier concentration such that under an inversion condition, the conduction and valence band energies ($E_C$, $E_V$) of the volume inversion region is less than the conduction and valence band energies ($E_{C,BULK}$, $E_{V,BULK}$) of the bulk semiconductor material throughout the channel region in a second direction crossing the first direction.

8. The semiconductor device of claim 1, further comprising a plurality of fin-shaped semiconductor structures each having a channel region, wherein the gate dielectric wraps each channel region and the gate electrode wraps the gate dielectric.

9. A semiconductor device, comprising:
   a non-silicon-on-insulator semiconductor substrate;
   a fin-shaped semiconductor structure extending laterally in a first direction and having a protruding portion protruding above adjacent isolation regions; and
   a gate stack formed on a channel region of the protruding portion, the channel region interposed laterally between a source region and a drain region, the gate stack including a gate dielectric formed on the channel region and a gate electrode formed on the gate dielectric,
   wherein the channel region is undoped and has a vertical height not exceeding 34 nm and a base width not exceeding 16 nm, wherein the channel region has opposing sidewalls that are tapered such that the channel region has a trapezoidal volume inversion region that is at least 25% of a vertical height of the channel region, and
   wherein the semiconductor device is configured such that when an inversion bias is applied to the gate electrode, conduction and valence band energies ($E_C$, $E_V$) within the volume inversion region fall below corresponding bulk conduction and valence band energies ($E_{C,BULK}$, $E_{V,BULK}$) of a bulk material of the channel region throughout a width of the channel region, wherein the width of the channel region extends in a second direction crossing the first direction.

10. The semiconductor device of claim 9, wherein the channel region has a gate length in the second direction defined by a width of the gate electrode overlapping the channel region, wherein the base width of the channel region is between about 80% and about 200% of the gate length.

11. The semiconductor device of claim 10, wherein the volume inversion region has a minimum width between about 3 nm and about 5 nm and a maximum width between about 4 nm and about 8 nm.

12. The semiconductor device of claim 11, wherein the tapered sidewalls form an angle between 88 and 80 degrees relative to a direction normal to a major surface of the semiconductor.

13. The semiconductor device of claim 11, wherein the volume inversion region is configured to form the volume inversion bias is between 0.2V and 0.8V between the gate electrode and the substrate.

14. The semiconductor device of claim 11, wherein the fin-shaped semiconductor structure extends in a <110> direction and the channel region forms an n-channel of an n-channel finFET transistor.

15. The semiconductor device of claim 11, wherein the fin-shaped semiconductor structure extends in a <100> direction and the channel region forms a p-channel of a p-channel finFET transistor.

16. The semiconductor device of claim 11, wherein the trapezoidal volume inversion region is between about 50% and about 90% of the vertical height of the channel region.

17. The semiconductor device of claim 1, wherein each of the minimum width and the maximum width of the volume inversion region is less than twice a maximum depletion width of a corresponding bulk channel formed of the same material and having the same carrier concentration as the channel region.

18. A semiconductor device, comprising:
- a non-silicon-on-insulator semiconductor substrate having isolation regions formed therein;
- a fin-shaped semiconductor structure protruding vertically above the isolation regions and extending laterally in a first direction; and
- a gate dielectric directly overlying a channel region of the fin-shaped semiconductor structure and a gate electrode directly overlying the gate dielectric, the channel region being interposed in the first direction between a source region and a drain region, wherein the channel region has sloped sidewalls and a width that continuously decreases from a base towards a peak of the channel region, and wherein the channel region comprises an undoped volume inversion region having a minimum width between about 3 nm and about 4 nm and a maximum width between about 4 nm and about 8 nm, the volume inversion region further having a height extending downwardly from an apex of the fin-shaped semiconductor structure, the height being greater than about 25% of a total height of the channel region, wherein the shape and dimensions of the undoped volume inversion region is such that, under an inversion condition, the conduction and valence band energies ($E_C$, $E_V$) of the entire undoped volume inversion region falls below corresponding conduction and valence band energies ($E_{C,BULK}$, $E_{V, BULK}$) of the bulk semiconductor material of the fin-shaped semiconductor structure.

* * * * *